United States Patent
Nagayama et al.

(10) Patent No.: US 10,860,277 B2
(45) Date of Patent: Dec. 8, 2020

(54) COUPLED DISPLAY DEVICE

(71) Applicants: Sharp Kabushiki Kaisha, Sakai (JP); Mitsubishi Electric Corporation, Tokyo (JP)

(72) Inventors: Kazumasa Nagayama, Sakai (JP); Nobuaki Aoki, Sakai (JP); Atsuhiko Nagamune, Chiyoda-ku (JP); Akitoshi Sudo, Chiyoda-ku (JP)

(73) Assignees: SHARP KABUSHIKI KAISHA, Sakai (JP); MITSUBISHI ELECTRIC CORPORATION, Tokyo (JP)

( * ) Notice: Subject to any disclaimer, the term of this patent is extended or adjusted under 35 U.S.C. 154(b) by 42 days.

(21) Appl. No.: 16/365,792

(22) Filed: Mar. 27, 2019

(65) Prior Publication Data

US 2019/0303085 A1 Oct. 3, 2019

(30) Foreign Application Priority Data

Mar. 29, 2018 (JP) .................................. 2018-064704

(51) Int. Cl.
*G06F 3/147* (2006.01)
*H05K 5/00* (2006.01)
(Continued)

(52) U.S. Cl.
CPC ........ *G06F 3/1446* (2013.01); *G02F 1/13336* (2013.01); *G02F 1/133305* (2013.01);
(Continued)

(58) Field of Classification Search
CPC .......... G02F 2001/133354; G02F 2001/33388; G02F 1/1336; G02F 1/1333; G02F 1/133;
(Continued)

(56) References Cited

U.S. PATENT DOCUMENTS

2006/0274029 A1* 12/2006 Hong ....................... G09G 3/20
  345/104
2008/0186252 A1* 8/2008 Li ........................ H04N 9/3147
  345/1.1
(Continued)

FOREIGN PATENT DOCUMENTS

JP     2009-294574 A    12/2009

OTHER PUBLICATIONS

Andrews et al, "Information visualization on large, high-resolution displays: Issues, challenges, and opportunities", Information Visualization 10(4) 341-355. (Year: 2011).*

*Primary Examiner* — Julie Anne Watko
(74) *Attorney, Agent, or Firm* — Keating & Bennett, LLP

(57) ABSTRACT

A coupled display device includes a first display unit and a second display unit arranged adjacent to each other and coupled. The first display unit includes a first display portion and a first frame portion including two first linear sections and two second linear sections perpendicular to the first linear sections. The second display unit includes a second display portion and a second frame portion including two third linear sections and two fourth linear sections. The first display unit is set in a first position. The second display unit is set in a second position that is inverted from the first position. The first linear sections and the third linear sections extend in an arrangement direction in which the first display unit and the second display unit are arranged. The second linear sections and the fourth linear sections extend in a direction perpendicular to the arrangement direction.

5 Claims, 8 Drawing Sheets

(51) Int. Cl.
*G02F 1/1333* (2006.01)
*G06F 3/14* (2006.01)
*G09G 3/34* (2006.01)

(52) U.S. Cl.
CPC ..... *G02F 1/133308* (2013.01); *H05K 5/0017* (2013.01); *H05K 5/0021* (2013.01); *H05K 5/0065* (2013.01); *G02F 2001/133354* (2013.01); *G02F 2001/133374* (2013.01); *G02F 2001/133388* (2013.01); *G09G 3/34* (2013.01); *G09G 2300/026* (2013.01); *H05K 5/0073* (2013.01)

(58) Field of Classification Search
CPC ..... G02F 1/13; G02F 1/01; G02F 1/00; G02F 2001/133374; G02F 1/13338; G02F 2001/133391; G02F 1/133305; G02F 1/133308; G02F 2001/13322; G02F 2001/133325; H05K 5/0021; H05K 5/0065; H05K 5/0017; H05K 5/00; H05K 5/0073; H05K 7/023; H05K 5/0026; G06F 1/1446; G06F 3/1423; G06F 3/14; G06F 3/00; G09G 3/34; G09G 3/20; G09G 3/00; G09G 2300/026; G09G 2300/02; G09G 2300/23

See application file for complete search history.

(56) References Cited

U.S. PATENT DOCUMENTS

| | | | |
|---|---|---|---|
| 2015/0211707 A1* | 7/2015 | Watanabe | G09G 3/3607 345/667 |
| 2016/0014882 A1* | 1/2016 | Jongman | G02F 1/13338 361/749 |
| 2017/0148374 A1* | 5/2017 | Lee | G09G 5/14 |
| 2017/0303407 A1* | 10/2017 | Lee | H01L 25/10 |
| 2018/0307270 A1* | 10/2018 | Pantel | H04M 1/0266 |
| 2020/0058730 A1* | 2/2020 | Ha | H05K 5/0017 |

* cited by examiner

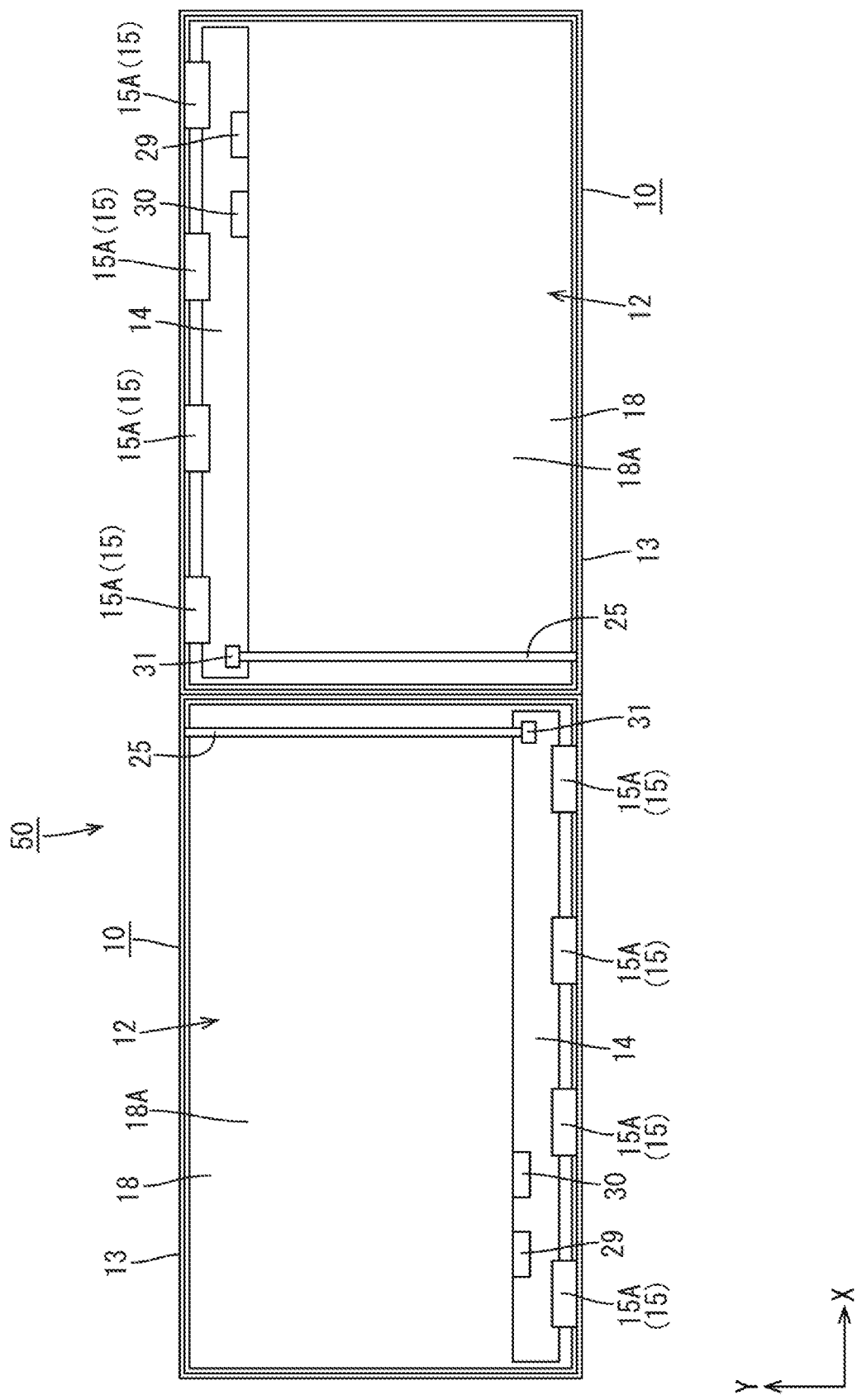

COUPLED DISPLAY DEVICE

CROSS REFERENCE TO RELATED APPLICATION

This application claims priority from Japanese Patent Application No. 2018-064704 filed on Mar. 29, 2018. The entire contents of the priority application are incorporated herein by reference.

TECHNICAL FIELD

The technology described herein relates to a coupled display device.

BACKGROUND

An example of a known multiscreen display device is disclosed in Japanese Unexamined Patent Application Publication No. 2009-294574. The multiscreen display device disclosed in Japanese Unexamined Patent Application Publication No. 2009-294574 includes multiple display devices each including a display unit that displays an image and a frame unit that surrounds the outer periphery of the display unit. The respective frame units of the display devices are in close proximity to each other. Each of the frame units has its outer peripheral surface provided with depressions depressed from the outer peripheral surface toward a corresponding one of the display units and projections projecting from the outer peripheral surface toward a side opposite to the corresponding display unit. The depressions and projections of the display devices, which are in close proximity to each other, fit together.

A multiscreen display device such as that disclosed in Japanese Unexamined Patent Application Publication No. 2009-294574 includes display devices differing in structure from each other according to placement in the multiscreen display device. For this reason, the cost of manufacturing each display device has undesirably tended to be high.

SUMMARY

The technology described herein was made in view of the above circumstances. An object is to reduce manufacturing costs.

A coupled display device according to the technology described herein includes a first display unit and a second display unit that are arranged adjacent to each other and coupled. The first display unit has a rectangular outline. The first display unit includes a first display portion in which an image is displayed and a first frame portion having a frame shape to surround the first display portion. The first frame portion includes two first linear sections and two linear sections that are perpendicular to the first linear sections. The second display unit has a rectangular outline. The second display unit includes a second display portion in which an image is displayed and a second frame portion having a frame shape to surround the second display portion. The second frame portion includes two third linear sections and two fourth linear sections. The first display unit is set in a first position. The second display unit is set in a second position that is inverted from the first position. The first display unit and the second display unit are arranged adjacent to each other and coupled. The first linear sections and the third linear sections extend in an arrangement direction in which the first display unit and the second display unit are arranged. The second linear sections and the fourth linear sections extend in a direction perpendicular to the arrangement direction. One of the second linear sections and one of the fourth linear sections are disposed adjacent to each other.

In comparison to a display device including a single display unit, images are displayed in the respective display portions that are adjacent to each other in the display device according to the technology described herein. Therefore, a large screen display is possible. The first linear sections and the second linear sections of the first frame portion and the third linear sections and the fourth linear sections of the second frame portion define display areas. The first display unit and the second display unit are coupled with the first linear sections and the third linear sections disposed in lines. Therefore, even if the first display unit and the second display unit in positions that are inverted from each other are coupled to each other, the display areas are less likely to be displaced from each other in a direction perpendicular to an arrangement direction in which the first display unit and the second display unit are arranged. Furthermore, the first display unit and the second display unit are less likely to be displaced from each other in the direction perpendicular to the arrangement direction. According to the configuration, higher display quality and better aspect can be achieved. The first display unit and the second display unit are disposed in the positions that are inverted from each other. The first display unit and the second display unit have a common configuration. The configuration of the display device is preferable for reducing the production cos.

According to the technology described herein, the production cost can be reduced.

BRIEF DESCRIPTION OF THE DRAWINGS

FIG. 8 is a back view of the coupled liquid crystal display device.

DETAILED DESCRIPTION

First Embodiment

Figure 1:
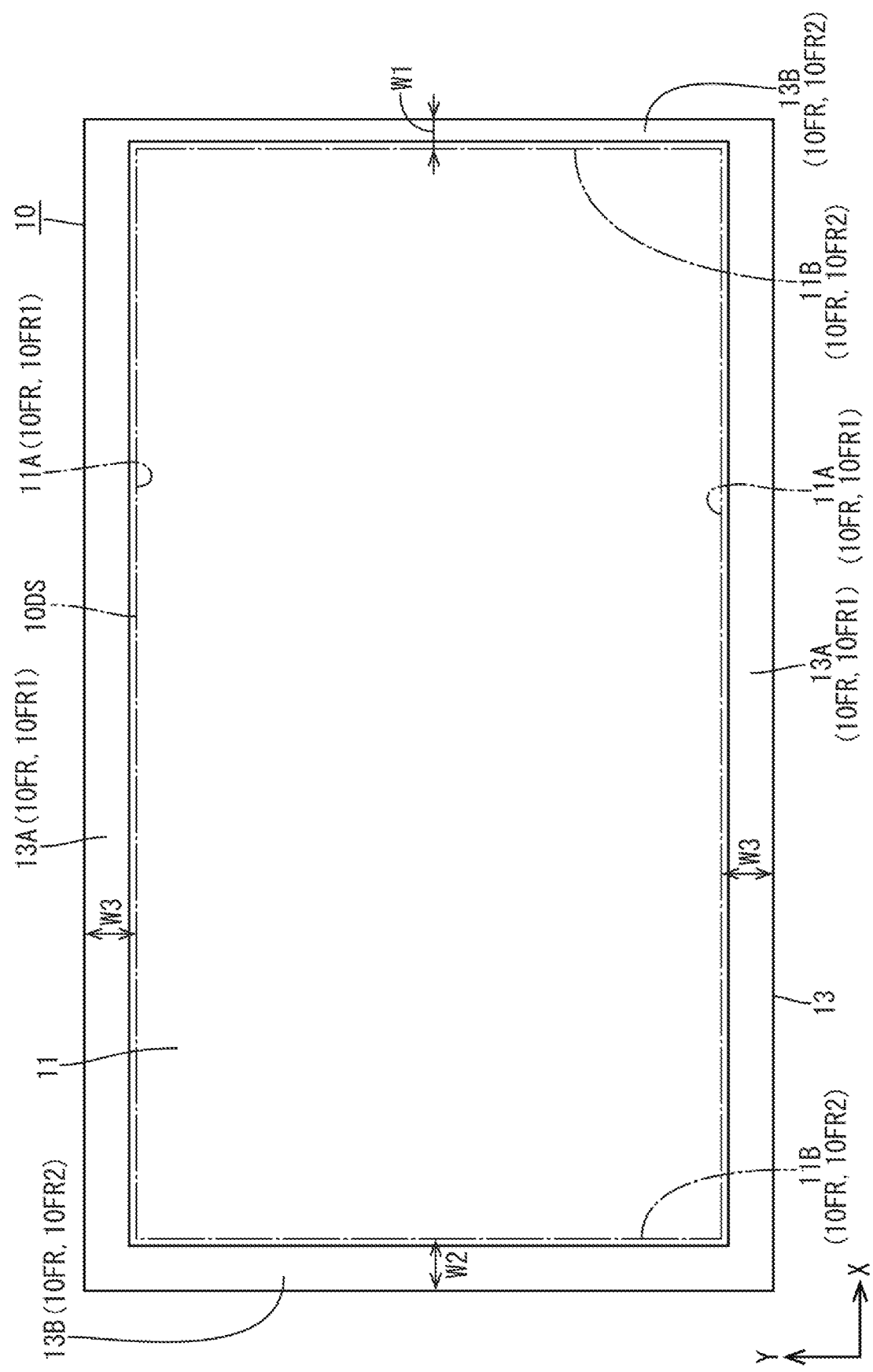
FIG. 1 is a plan view of a liquid crystal display device according to a first embodiment.

A first embodiment is described with reference to FIGS. 1 to 8. A coupled liquid crystal display device 50 (a coupled display device) according to the first embodiment includes liquid crystal display units 10 (a first display unit and a second display unit). The X axes, the Y axes, and the Z axes may be present in the drawings. The axes in each drawing correspond to the respective axes in other drawings to indicate the respective directions. An upper side and a lower side in FIGS. 2 and 3 correspond to a front side and a back side of the liquid crystal display unit 10, respectively.

First, the liquid crystal display unit 10 will be described. As shown in FIG. 1, the liquid crystal display unit 10 has a horizontally long substantially rectangular shape as a whole.

Figure 2:
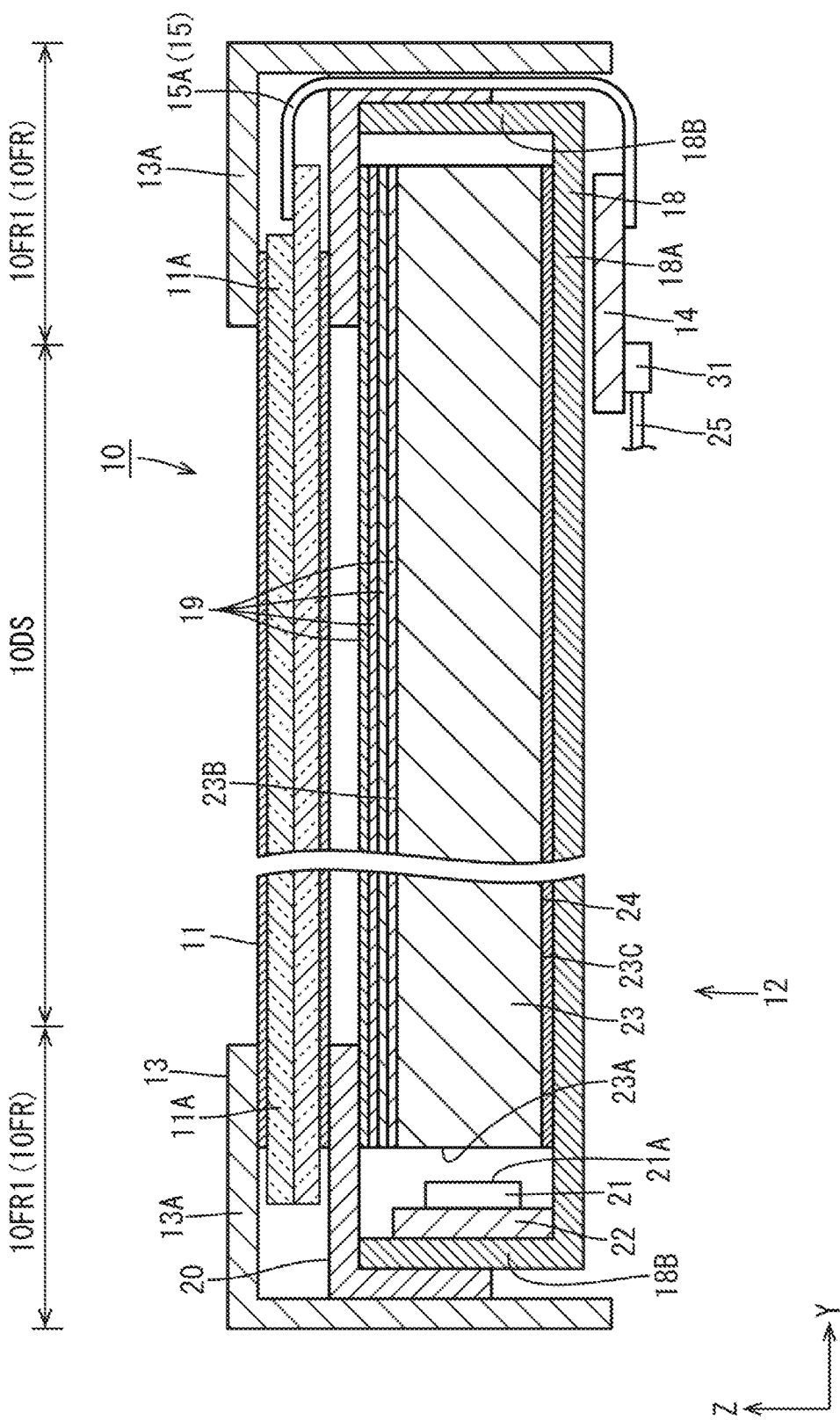
FIG. 2 is a cross-sectional view of the liquid crystal display device as taken along a short side direction.
Figure 3:
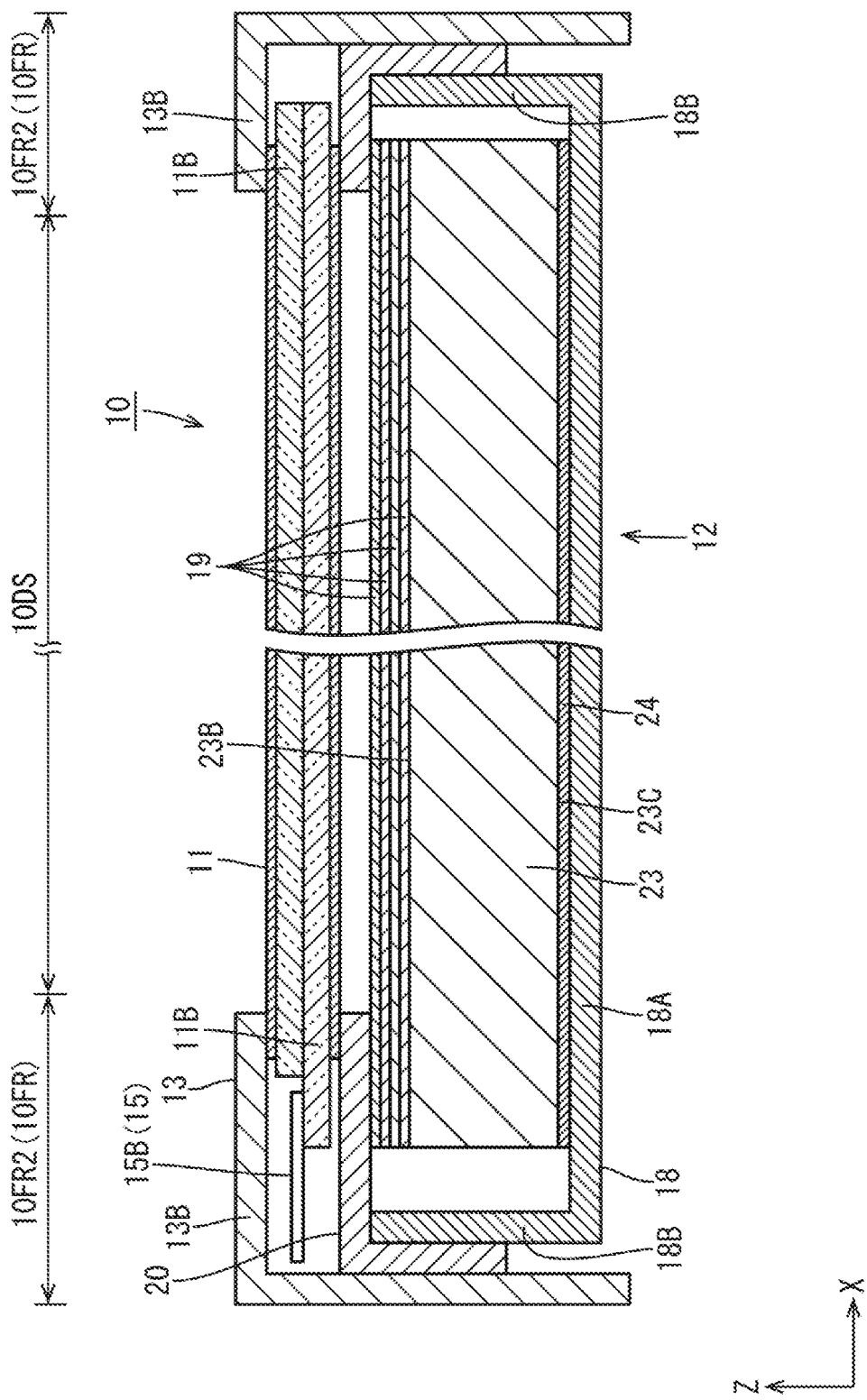
FIG. 3 is a cross-sectional view of the liquid crystal display device as taken along a long side direction.
Figure 7:
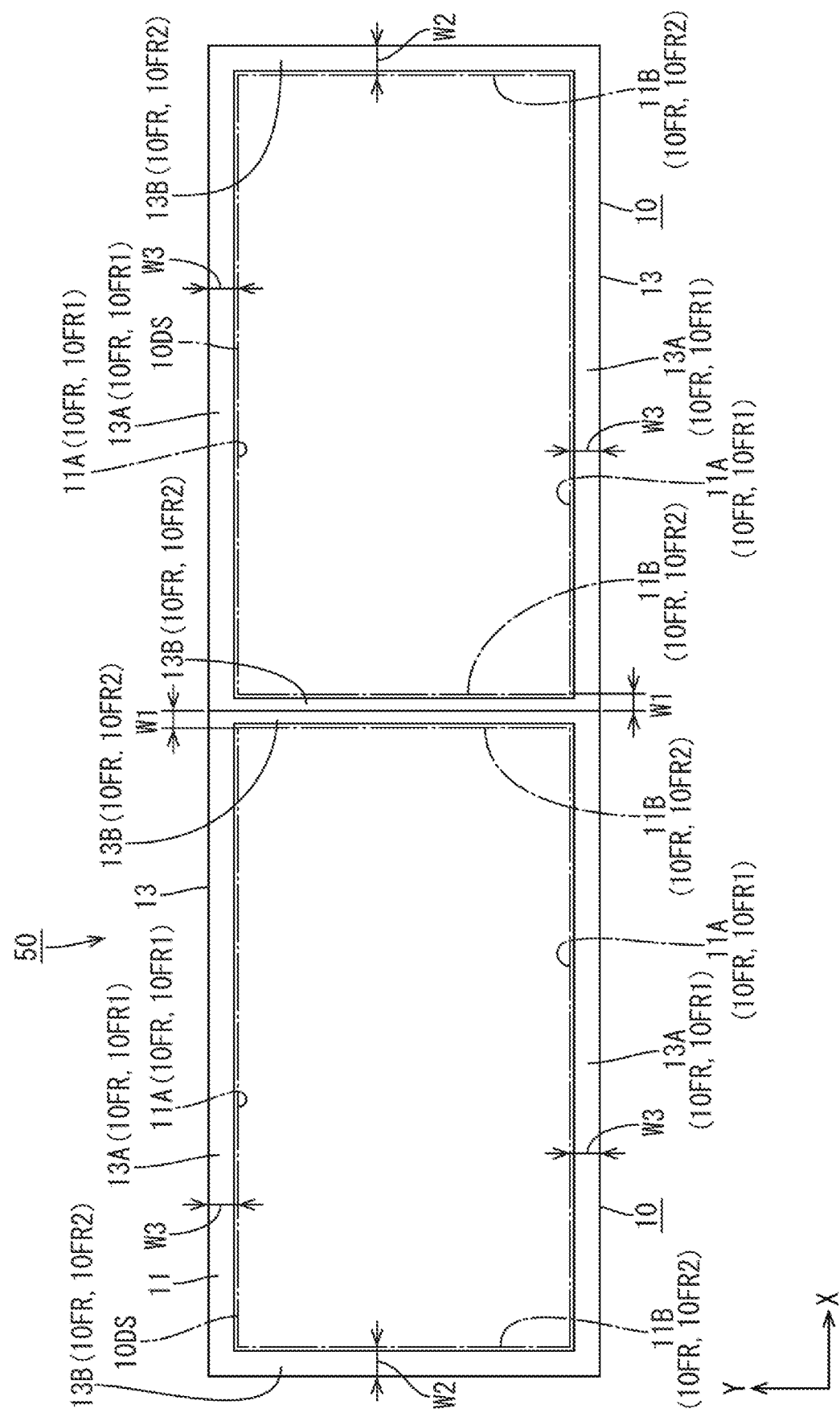
FIG. 7 is a plan view of a coupled liquid crystal display device.

As shown in FIGS. 2 and 3, the liquid crystal display unit 10 includes a liquid crystal panel 11 (a first display panel, a second display panel) configured to display images and a backlight device 12 (a first lighting device, a second lighting device) configured to supply light to the liquid crystal panel 11 for image display. The liquid crystal panel 11 and the backlight device 12 are integrally held by a frame-shaped bezel 13. Furthermore, the liquid crystal display unit 10 includes a control substrate 14 for controlling the driving of the liquid crystal panel 11 and the backlight device 12. As shown in FIG. 1, the liquid crystal display unit 10 includes a display portion 10DS (a first display portion, a second display portion) and a frame portion 10FR (a first frame portion, a second frame portion). The display portion 10DS is a center portion of the liquid crystal panel 11 for displaying images. The frame portion 10FR includes an outer peripheral portion of the liquid crystal panel 11 and the entire area of the bezel 13. The frame portion 10FR has a frame shape to surround the display portion 10DS. The frame portion 10FR includes two first linear sections 10FR1 (first linear sections, third linear sections) that extend along an X-axis direction (an arrangement direction in which the liquid crystal display units 10 are arranged) and two second linear sections 10FR2 (second linear sections, fourth linear sections) that extend along a Y-axis direction (a direction perpendicular to the arrangement direction). Thus, the first linear sections 10FR1 and the second linear sections 10FR2 of the frame portion 10FR define a display area of the display portion 10DS in which images are displayed. The bezel 13 includes two long portion 13A included in the first linear sections 10FR1 and two short portions 13B included in the second linear sections 10FR2. An area indicated by a chain line in each of FIGS. 1 and 7 illustrates the display area of the display portion 10DS.

As shown in FIGS. 2 and 3, the liquid crystal panel 11 includes two glass substrates bonded together with a predetermined gap therebetween and a liquid crystal layer sealed between the glass substrates. The liquid crystal layer includes liquid crystal molecules that are substances having optical properties that vary according to application of a voltage. One (namely an array substrate or an active matrix substrate) of the glass substrates has an inner surface over which switching elements (e.g. TFTs) connected to source lines and gate lines that are perpendicular to each other and pixel electrodes connected to the switching elements and placed in square regions surrounded by the source lines and the gate lines are two-dimensionally arranged in a matrix and an alignment film and the like are further provided. The other (namely a counter substrate or a CF substrate) of the glass substrates has an inner surface over which a color filter having colored portions such as R (red) portions, G (green) portions, B (blue) portions, and the like two-dimensionally arranged in a matrix in a predetermined array is provided and a light-blocking layer (black matrix) placed between the colored portions to form a grid shape, a solid counter electrode opposed to the pixel electrodes, an alignment film, and the like are further provided. It should be noted that a polarizing plate is disposed on an outer surface of each of the two glass substrates. Further, the liquid crystal panel 11 has its long side direction corresponding to the X-axis direction, its short side direction corresponding to the Y-axis direction, and its thickness direction corresponding to a Z-axis direction.

Figure 4:
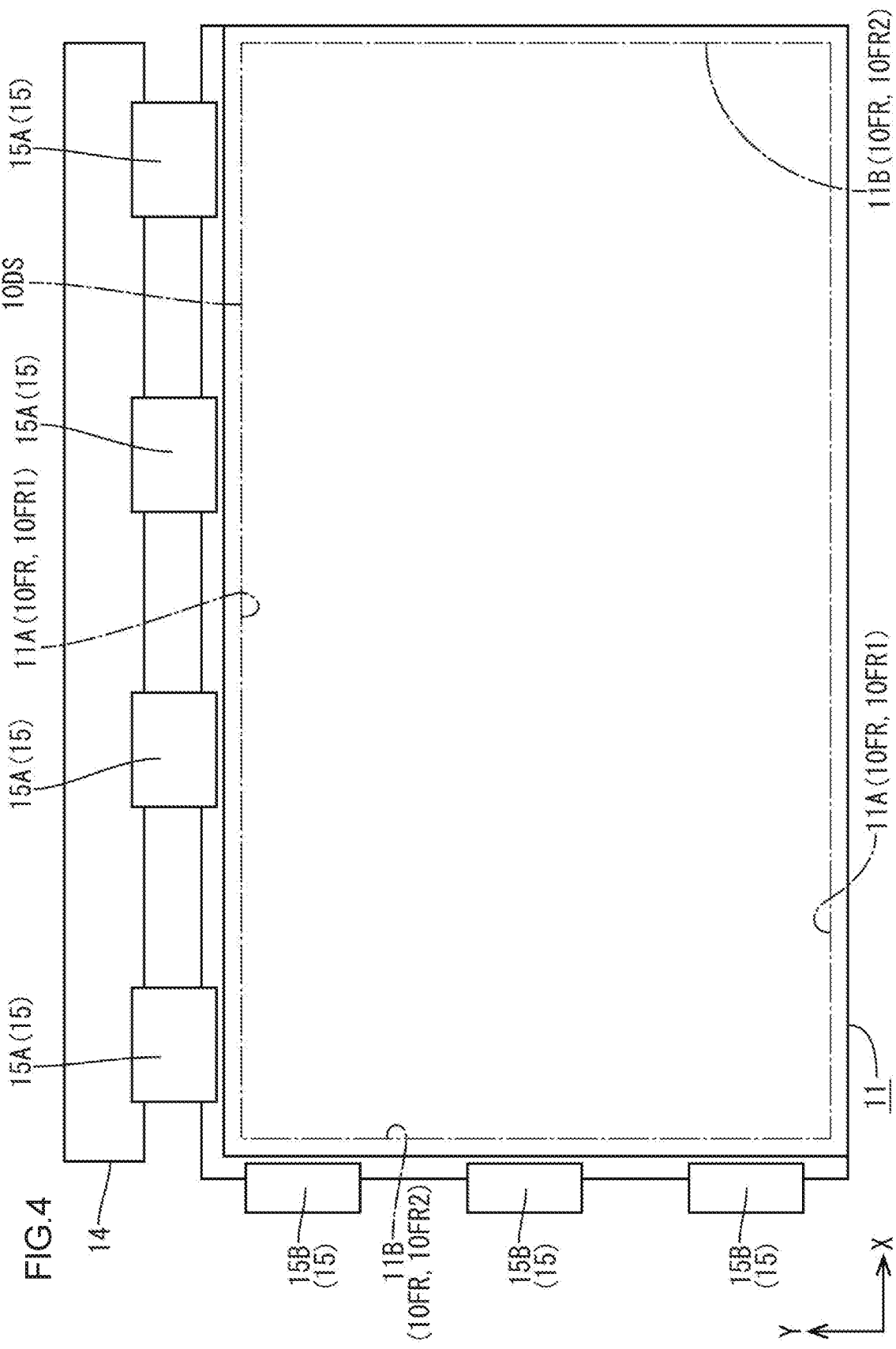
FIG. 4 is a plan view of a liquid crystal panel, flexible substrates, and a control substrate that constitute the liquid crystal display device.

As shown in FIG. 4, the outer peripheral portion of the liquid crystal panel 11 included in the frame portion 10FR includes two long edges 11A included in the first linear sections 10FR1 and two short edges 11B that constitute the second linear sections 10FR2. Connected to the outer peripheral portion of the liquid crystal panel 11 is a first end of each of multiple panel flexible substrates (flexible substrates) 15. The panel flexible substrates 15 are each mounted with a driver by COF (chip on film), and this driver includes an LSI chip having a drive circuit inside. The panel flexible substrates 15 include a first panel flexible substrate 15A (a first connecting component) having its first end connected to one of the long edges 11A (first linear sections 10FR1) of the outer peripheral portion (frame portion 10FR) of the liquid crystal panel 11 and a second panel flexible substrate 15B (a first connecting component, a second connecting component) having its first end connected to one of the short edges 11B (second linear sections 10FR2) of the outer peripheral portion of the liquid crystal panel 11. More than one (in FIG. 4, four) of these first panel flexible substrates 15A are placed at intervals along the X-axis direction and have their respective second ends connected to the control substrate 14. The control substrate 14 has a long slender plate shape that extends along the X-axis direction and, as shown in FIG. 2, is placed behind the backlight device 12. Accordingly, the first panel flexible substrates 15A, which are connected to the liquid crystal panel 11 and the control substrate 14, are bent (curved) in a folded manner. Signals that are transmitted from the control substrate 14 are supplied to the liquid crystal panel 11 via the first panel flexible substrates 15A. The first panel flexible substrates 15A use their own drivers to perform signal processing to supply video signals to the liquid crystal panel 11 and, for example, transmit signals that are supplied to the second panel flexible substrate 15B. As shown in FIGS. 3 and 4, a signal transmitted to the liquid crystal panel 11 via a first panel flexible substrate 15A is supplied to the second panel flexible substrate 15B via a wire (not illustrated) formed in the outer peripheral portion of the liquid crystal panel 11. The second panel flexible substrate 15B uses its own driver to perform signal processing to supply a scanning signal to the liquid crystal panel 11. More than one (in FIG. 4, three) of these second panel flexible substrates 15B are placed at intervals along the Y-axis direction. The panel flexible substrates 15 each include a base material made of flexible synthetic resin material having insulating properties (such as polyimide resin) and a large number of wiring patterns (not illustrated) on the base material. The control substrate 14 includes a base material that is higher in rigidity (more rigid) than those of the panel flexible substrates 15 and various types of electronic components mounted on a plate surface of the base material. The first panel flexible substrates 15A described above are "panel connecting components" that are connected to the liquid crystal panel 11 and the control substrate 14.

As shown in FIGS. 2 and 3, the backlight device 12 includes a substantially box-shaped chassis (housing) 18 having an opening facing toward the front side (i.e. toward the liquid crystal panel 11), an optical member (optical sheet) 19 disposed to cover the opening of the chassis 18, and a frame 20 that supports the optical member 19 from the front side. Furthermore, the chassis 18 houses an LED (light-emitting diode) 21 serving as a light source, an LED substrate (light source substrate) 22 on which the LED 21 is mounted, a light-guiding plate 23 that guides light from the LED 21 toward the optical member 19 (liquid crystal panel 11), and a reflecting sheet 24 disposed on a back side of the light-guiding plate 23. Moreover, the backlight device 12 is a one-side light entrance edge-lighting (side-lighting) backlight device in which the LED 21 is disposed at one end of the backlight device 12 in a short side direction (Y-axis direction) so that light from the LED 21 enters the light-guiding plate 23 through one side. The following describes each constituent component of the backlight device 12 in detail.

The chassis 18 is made of metal and, as shown in FIGS. 2 and 3, includes a bottom part 18A having a horizontally long substantially square shape which is similar to that of the liquid crystal panel 11 and a side part 18B rising from the outer edge of each side of the bottom part 18A. The bottom part 18A has its long side direction corresponding to the X-axis direction (horizontal direction) and its short side direction corresponding to the Y-axis direction (vertical direction). Further, the frame 20 and the bezel 13 may be fixed to each side part 18B.

As shown in FIGS. 2 and 3, by covering the opening of the chassis 18 and being placed between the liquid crystal panel 11 and the light-guiding plate 23, the optical member 19 transmits emitted light from the light-guiding plate 23 and, while imparting a predetermined optical effect to the transmitted light, causing the transmitted light to exit toward the liquid crystal panel 11. The optical member 19 includes multiple (in the first embodiment, four) optical members. Specific examples of types of the optical members include a diffusion sheet, a lens sheet (prism sheet), a reflective polarizing sheet, a lens diffuser, and the like from which a selection can be made as appropriate for use. The frame 20 has a horizontally long frame shape, substantially entirely holds and supports the outer peripheral edges of the optical member 19 and the light-guiding plate 23 from the front side, and substantially entirely receives and supports the outer peripheral edges of the liquid crystal panel 11 from the back side.

As shown in FIG. 2, the LED 21 includes a base member that is firmly fixed to the LED substrate 22, an LED chip on the base member, and a sealant sealing the LED chip. The LED 21 emits white light as a whole by having its LED chip designed to monochromatically emit blue light and having its sealant dispersedly blended with phosphors (such as a yellow phosphor, a green phosphor, and a red phosphor). The LED 21 has its light-emitting surface 21A opposed to a surface thereof mounted on the LED substrate 22, which will be described next. As such, the LED 21 is a so-called top-emitting light-emitting diode.

As shown in FIG. 2, the LED substrate 22 has a plate shape that extends along the X-axis direction, and is accommodated in the chassis 18 in such a position that a plate surface of the LED substrate 22 runs parallel to the X-axis direction and the Z-axis direction. The LED substrate 22 is mounted in such a manner that a mounting surface of the LED substrate 22 on which more than one of these LEDs 21 are mounted faces an end face (light entrance end face 23A) of the light-guiding plate 23, which will be described next, and a plate surface of the LED substrate 22 opposite to the mounting surface on which the LEDs 21 are mounted makes contact with a side part 18B of the chassis 18. The mounting surface of the LED substrate 22 on which the LEDs 21 are mounted is constituted by a metal film (such as copper foil), and has formed thereon a wiring pattern (not illustrated) that is connected to a terminal or the like of each LED 21. The multiple LEDs 21 are placed at intervals along the X-axis direction on the mounting surface of the LED substrate 22. The LED substrate 22 is provided with a feeding connector (not illustrated) to which a backlight flexible flat cable (light source feed component) 25 has its first end connected. The backlight flexible flat cable 25 has its second end drawn out of the chassis 18 and connected to the control substrate 14 (see FIG. 5). The backlight flexible flat cable 25 includes multiple wiring parts running parallel to each other and flexible films having insulating properties, which are made of synthetic resin, between which the wiring parts are sandwiched.

The light-guiding plate 23 is made of a substantially transparent synthetic resin material (e.g. acrylic resin such as PMMA, polycarbonate, or the like), and has a sufficiently higher refractive index than air. As shown in FIGS. 2 and 3, the light-guiding plate 23 has a horizontally long plate shape which is similar to that of the liquid crystal panel 11 or the like, is accommodated in the chassis 18 in such a manner as to be surrounded by the chassis 18 on every side, and is located directly below the liquid crystal panel 11 and the optical member 19. As shown in FIG. 2, the light-guiding plate 23 has outer peripheral end faces including one long-side end face (left in FIG. 2) that serves as a light entrance end face (light source opposed end face) 23A, opposed to the LEDs 21, upon which light from the LEDs 21 falls. The light-guiding plate 23 has a pair of front and back plate surfaces. That one of these plate surfaces which faces toward the front side (i.e. toward the liquid crystal panel 11) serves as a light exit plate surface 23B that causes light to exit toward the liquid crystal panel 11, and that one of these plate surfaces which faces toward the back side serves as an opposite plate surface 23C opposed to the light exit plate surface 23B. With such a configuration, the light-guiding plate 23 has a function of introducing, through the light entrance end face 23A, light emitted along the Y-axis direction from the LEDs 21 and, after having propagated the light inside, raising the light along the Z-axis direction and causing the light to exit through the light exit plate surface 23B toward the optical member 19 (i.e. toward the front side or light exit side).

As shown in FIGS. 2 and 3, the reflecting sheet 24 is disposed to cover the opposite plate surface 23C of the light-guiding plate 23. The reflecting sheet 24 is high in light reflectivity and can efficiently raise, toward the front side (i.e. toward the light exist plate surface 23B), light leaked through the opposite plate surface 23C of the light-guiding plate 23.

Figure 6:
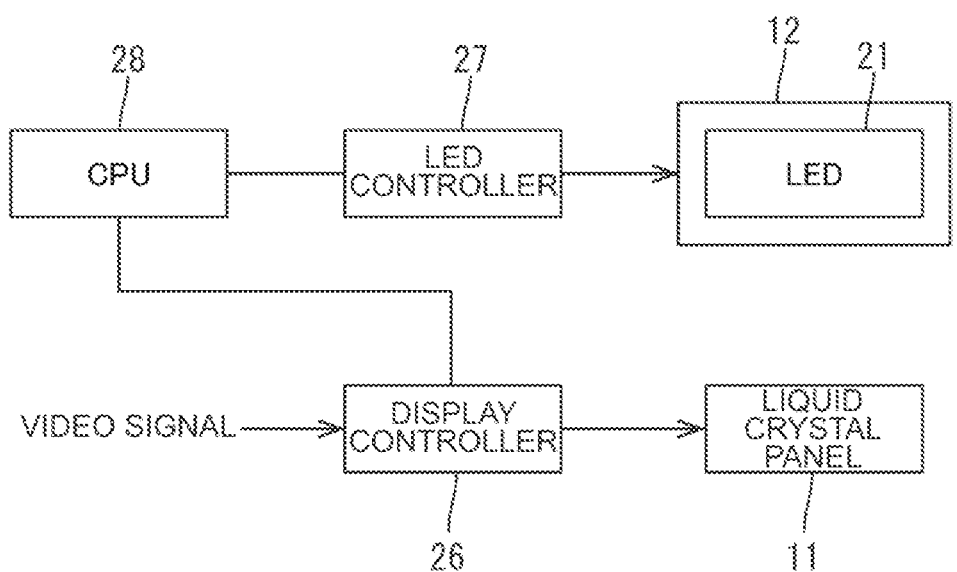
FIG. 6 is a block diagram showing an electrical configuration of the liquid crystal display device.

As shown in FIG. 6, the liquid crystal display unit 10 according to the first embodiment includes at least a display controller 26 (a first display panel controller, a second display panel controller) for controlling the driving of the liquid crystal panel 11 and an LED controller 27 (a light source controller) for controlling the driving of the LEDs 21 of the backlight device 12. The display controller 26 includes a video signal processing circuit that process video signals and a pixel driver that drives each pixel in accordance with output signals from the video signal processing circuit, and is provided on the control substrate 14. The LED controller 27 includes an LED driver that drives the LEDs 21, and is provided on the control substrate 14. The control substrate 14 is provided with a CPU 28 that controls how the display controller 26 and the LED controller 27 operate.

Figure 5:
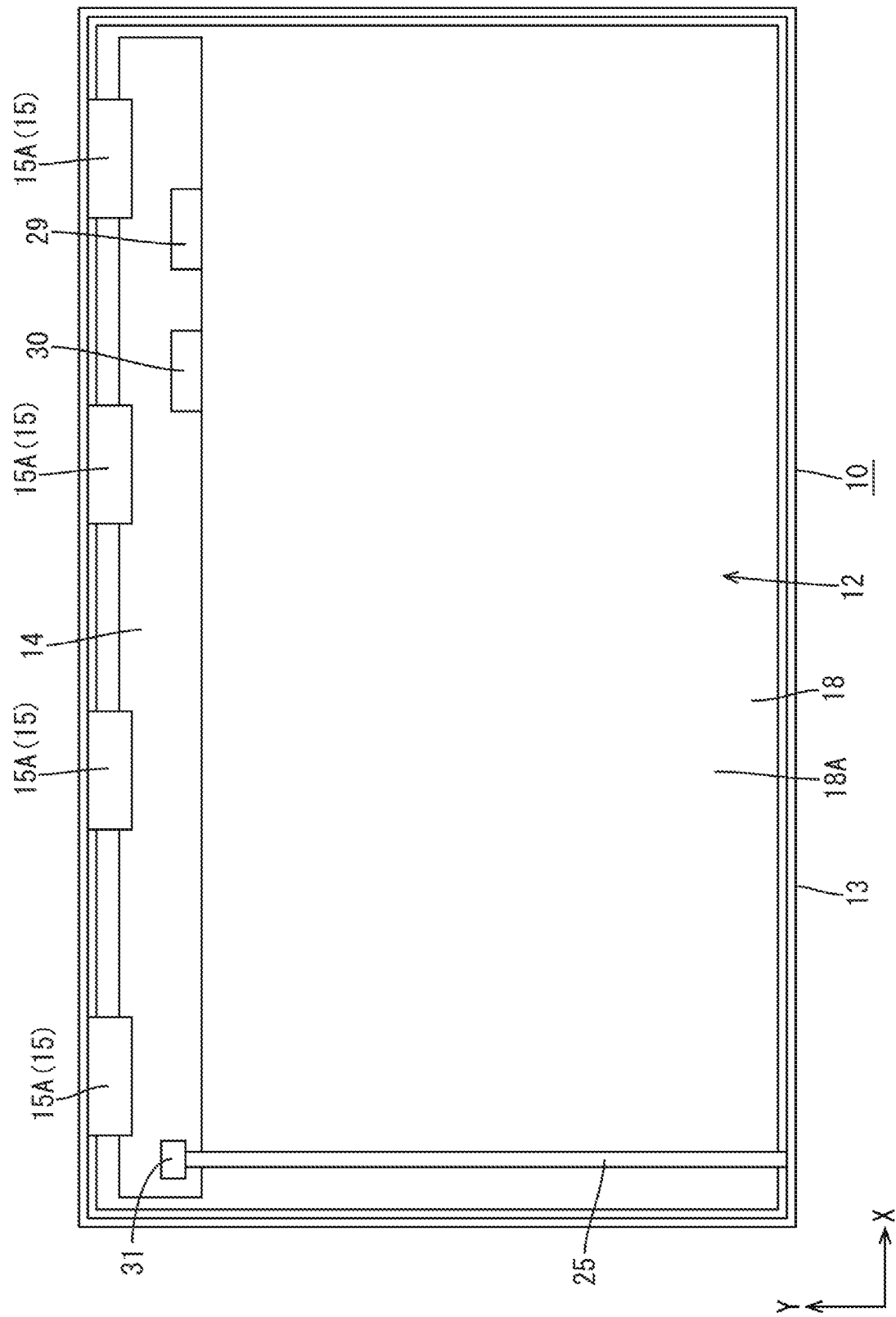
FIG. 5 is a back view of the liquid crystal display device.

As shown in FIGS. 2 and 5, the control substrate 14 is provided with a panel input connector 29 to which a connector of a flexible substrate having its first end connected to an external panel signal supply source and its second end provided with the connector is connected (neither the flexible substrate nor the external panel signal supply source illustrated) and to which a video signal is supplied, a backlight input connector 30 to which a connector of a flexible substrate having its first end connected to an external backlight signal supply source and its second end provided with the connector is connected (neither the flexible substrate nor the external backlight signal supply source illustrated) and to which a backlight signal is supplied, and a backlight output connector 31 to which the second end of the backlight flexible flat cable 25, which has its first end connected to the feeding connector of the LED substrate 22, is connected. The external panel signal supply source supplies an original video signal to the panel input connector 29 of the control substrate 14. The control substrate 14 processes the original video signal thus supplied. The liquid crystal panel 11 displays an image in accordance with the video signal thus processed. The external backlight signal supply source supplies an original backlight signal to the backlight input connector 30 of the control substrate 14. The control substrate 14 processes the original backlight signal thus supplied. The LEDs 21 are driven in accordance with an LED drive signal processed.

Next, the coupled liquid crystal display device 50 will be described. As shown in FIGS. 7 and 8, the coupled liquid crystal display device 50 includes two liquid crystal display units 10 coupled to each other after having been arranged adjacent to each other in the X-axis direction (the direction of arrangement). This allows a horizontally long image to be suitably displayed by the two liquid crystal display units 10. Specific suitable examples of uses of the coupled liquid crystal display device 50 include digital signage that is installed around the doors of a train, and suitable examples of images to be displayed include train maps and advertisements. It should be noted that the first embodiment omits to illustrate a specific coupling structure through which the liquid crystal display units 10 adjacent to each other are coupled to each other.

Moreover, as shown in FIGS. 7 and 8, the coupled liquid crystal display device 50 is configured such that the liquid crystal display units 10 arranged along the X-axis direction are set in positions that inverted to each other with respect to the Y-axis direction (the direction perpendicular to the arrangement direction). Specifically, one of the liquid crystal display units 10 is set in a first position in which the first panel flexible substrates 15A face toward an upper side in FIG. 7 or 8 (one side of the Y-axis direction). The other one of the liquid crystal display units 10 is set in a second position in which the first panel flexible substrates 15A face toward a lower side in FIG. 7 or 8 (the other side of the Y-axis direction), that is, inverted from the first position with respect to the Y-axis direction. In this embodiment, the liquid crystal display unit 10 on the left in FIG. 7 (or on the right in FIG. 8) is in the first position and the liquid crystal display unit 10 on the right in FIG. 7 (or on the left in FIG. 8) is in the second position. The display controller 26 controls the driving of the liquid crystal panel 11 so that an orientation of the image displayed in the display portion 10DS of the liquid crystal panel 11 in the liquid crystal display unit 10 in the first position and an orientation of the image displayed in the display portion 10DS of the liquid crystal panel 11 in the liquid crystal display unit 10 in the second position correspond with each other with respect to the Y-axis direction. Even if the liquid crystal display units 10 adjacent to each other in the X-axis direction are offset in the positions that are inverted from each other and coupled, images are properly displayed in the display portions 10DS of the respective liquid crystal panels 11 in the liquid crystal display units 10 adjacent to each other. Moreover, the liquid crystal display units 10 adjacent to each other in the X-axis direction have the same configuration. This configuration has an advantage in product cost reduction in comparison to a configuration in which different liquid crystal display units are arranged adjacent to each other in the X-axis direction.

Specifically, the display controller 26 enables a first display signal for display in the first position shown in FIG. 8 and a second display signal for display in the second position shown in FIG. 8 to be selectively outputted in accordance with a video signal that is supplied from the external panel signal supply source. More specifically, a video signal that is outputted from the external panel signal supply source includes either a first display trigger signal or a second display trigger signal. In a case where the first display trigger signal is included, the display controller 26 outputs the first display signal, and in a case where the second display trigger signal is included, the display controller 26 outputs the second display signal. The first display trigger signal and the second display trigger signal are supplied to an identical terminal of the panel input connector 29. One of the first and second trigger signals is a high-voltage signal, and the other of the first and second trigger signals is a low-voltage signal. Whether the external panel signal supply source outputs the first display trigger signal or the second display trigger signal may be controlled by adjusting the settings of the external panel signal supply source according to the position of the liquid crystal display unit 10 installed. Accordingly, regarding the liquid crystal display unit 10 shown in the first position on the right in FIG. 8, the inclusion of the first display trigger signal in the video signal that is outputted from the external panel signal supply source causes the first display signal to be outputted from the display controller 26 and supplied to the liquid crystal panel 11 via the first panel flexible substrates 15A. As a result, the first display signal causes an image appropriately oriented in the Y-axis direction to be displayed on the liquid crystal panel 11 of the liquid crystal display unit 10 placed in the first position. On the other hand, regarding the liquid crystal display unit 10 shown in the second position on the left in FIG. 8, the inclusion of the second display trigger signal in the video signal that is outputted from the external panel signal supply source causes the second display signal to be outputted from the display controller 26 and supplied to the liquid crystal panel 11 via the first panel flexible substrates 15A. As a result, the second display signal causes an image appropriately oriented in the Y-axis direction to be displayed on the liquid crystal panel 11 of the liquid crystal display unit 10 placed in the second position. By thus adjusting, according to the position of the liquid crystal display unit 10, whether the video signal that is outputted from the external panel signal supply source includes the first display trigger signal or the second display trigger signal, the orientation in the Y-axis direction of an image that is displayed on the liquid crystal panel 11 can be normalized.

Moreover, as shown in FIG. 7, the coupled liquid crystal display device 50 according to the first embodiment is configured such that the first linear sections 10FR1 constituting the frame portion 10FR of each of the liquid crystal display units 10 adjacent to each other in the X-axis direction are linearly aligned with the first linear sections 10FR1 constituting the frame portion 10FR of the other liquid crystal display unit 10, respectively. Specifically, the long portions 13A (first linear sections 10FR1) constituting the bezel 13 (frame portion 10FR) of the liquid crystal display unit 10 placed in the first position as shown on the left in FIG. 7 have their X-axis inner and outer edges linearly aligned with those of the long portions 13A constituting the bezel 13 of the liquid crystal display unit 10 placed in the second position as shown on the right in FIG. 7, respectively. Similarly, the long edges 11A (first linear sections 10FR1) constituting the outer peripheral portion (frame portion 10FR) of the liquid crystal display unit 10 placed in the first position as shown on the left in FIG. 7 have their X-axis inner edges linearly aligned with those of the long edges 11A constituting the outer peripheral portion of the liquid crystal display unit 10 placed in the second position as shown on the right in FIG. 7. This makes it possible to, even when the liquid crystal display units 10 adjacent to each other in the X-axis direction are coupled to each other in positions that are reversals of each other, avoid upward and downward displacements of the ranges of display of the liquid crystal display units 10 from each other in the Y-axis direction and avoid upward and downward displacements of the outer shapes of the liquid crystal display units 10 from each other in the Y-axis direction. This results in higher display quality and better external appearance. As shown in FIG. 4, the long edges 11A of the liquid crystal panel 11 are different in width from each other. Meanwhile, as shown in FIG. 1, the long portions 13A of the bezel 13 of the liquid crystal display unit 10 are substantially equal in width to each other. As a result, as shown in FIG. 7, the coupled liquid crystal display device 50 is configured such that the long portions 13A of the bezel 13 of each of the liquid crystal display units 10 respectively placed in the first and second positions have their inner and outer edges linearly aligned with those of the long portions 13A of the bezel 13 of the other liquid crystal display unit 10, respectively, and the long edges 11A of the liquid crystal panel 11 of each of the liquid crystal display units 10 respectively placed in the first and second positions have their inner edges linearly aligned with those of the long edges 11A of the liquid crystal panel 11 of the other liquid crystal display unit 10, respectively.

As shown in FIG. 1, the frame portion 10FR of the liquid crystal display unit 10 is configured such that the second linear sections 10FR2 different widths W1 and W2 from each other. Specifically, the width dimension W2 of that one of the second linear sections 10FR2 constituting the frame portion 10FR which overlaps the second panel flexible substrates 15B in a plan view is larger than the width W1 of the second linear section 10FR2 that does not overlap the second panel flexible substrates 15B in a plan view (see FIGS. 3 and 4). This makes it possible to secure a sufficient space for mounting the second panel flexible substrates 15B. Moreover, as shown in FIG. 7, the liquid crystal display units 10 adjacent to each other in the X-axis direction in the coupled liquid crystal display device 50 are each configured such that the width W1 of the second linear section 10FR2 on a center side (adjacent side) is smaller than the width W2 of the second linear section 10FR2 on an end side (side opposite to the adjacent side). That is, the coupled liquid crystal display device 50 is configured such that that one of the second linear sections 10FR2 of the frame portion 10FR of the liquid crystal display unit 10 placed in the first position which is relatively small in width W1 and that one of the second linear sections 10FR2 of the frame portion 10FR of the liquid crystal display unit 10 placed in the second position which is relatively small in width W1 are placed adjacent to each other. Note here that the respective second linear sections 10FR2 of the frame portions 10FR that are adjacent to each other are interposed between two images respectively displayed on the respective display portions 10DS of the liquid crystal display units 10 adjacent to each other in the X-axis direction. Since the width W1 of each of the second linear sections 10FR2 on the adjacent side is smaller than the width W2 of each of the second linear sections 10FR2 on the sides opposite to the adjacent side, the two images respectively displayed on the respective display portion 10DS of the liquid crystal display units 10 adjacent to each other are placed closer to each other. This results in higher display quality.

As shown in FIG. 7, the liquid crystal display units 10 adjacent to each other in the coupled liquid crystal display device 50 are each configured such that the width W2 of the second linear section 10FR2 on the end side of the frame portion 10FR (side opposite to the adjacent side) is equal to a width W3 of each of the first linear sections 10FR1. In each frame portion 10FR, the width W3 of the first linear sections 10FR1 and the width W2 of one of the second linear sections 10FR2 excluding the second linear section 10FR2 adjacent to the other frame portion 10FR are equal to each other. This results in better external appearance of the coupled liquid crystal display device 50.

Further, as shown in FIG. 2, while one of the first linear sections 10FR1 constituting the frame portion 10FR of the liquid crystal display unit 10 is disposed to overlap the first panel flexible substrates 15A in a plan view, the other first linear section 10FR1 is disposed not to overlap the first panel flexible substrates 15A in a plan view. Moreover, as shown in FIG. 2, the LEDs 21 of the backlight device 12 are disposed to overlap the other of the first linear sections 10FR1 constituting the frame portion 10FR. That is, since the LEDs 21 are disposed not to overlap the first panel flexible substrates 15A, the first linear sections 10FR1 are more suitably made equal in width W3 to each other than if the LEDs 21 are disposed to overlap the first panel flexible substrates 15A. Further, since the LEDs 21 and the first panel flexible substrates 15A produce heat while in use, disposing them not to overlap each other dispersedly places heat sources in the Y-axis direction to make it hard for locally high-temperature areas to appear.

As described above, a coupled liquid crystal display device 50 (coupled display device) according to the first embodiment includes liquid crystal display units 10 (display units) arranged adjacent to each other and coupled to each other in positions that are reversals of each other, each of the liquid crystal display units 10 including a display portion 10DS on which an image is displayed and a frame portion 10FR having a frame shape that surrounds the display portion 10DS and being square in outer shape. In the coupled liquid crystal display device 50, the frame portion 10FR includes a pair of first linear sections 10FR1 that extend along a direction of arrangement of the liquid crystal display units 10 and a pair of second linear sections 10FR2 that extend along the direction perpendicular to the arrangement direction, and the liquid crystal display units 10 adjacent to each other are placed so that the first linear sections 10FR1 of one of the liquid crystal display units 10 are linearly aligned with the first linear sections 10FR1 of another one of the liquid crystal display units 10, respectively.

This causes images to be displayed on the display portions 10DS of the liquid crystal display units 10 adjacent to each other, respectively, and therefore enables a display that is larger in screen size than a display on a single liquid crystal display unit 10. The pair of first linear sections 10FR1 and the second linear sections 10FR2 of the frame portion 10FR having a frame shape that surrounds the display portion 10DS define a range of display of an image. Moreover, the liquid crystal display units 10 adjacent to each other are placed so that the pairs of first linear sections 10FR1 of the frame portions 10FR that extend along the direction of arrangement are linearly aligned with each other, respectively. This makes it possible to, even when the liquid crystal display units 10 adjacent to each other are coupled to each other in positions that are reversals of each other, avoid displacements of the ranges of display of the liquid crystal display units 10 from each other in the orthogonal direction of arrangement and avoid displacements of the outer shapes of the liquid crystal display units 10 from each other in the orthogonal direction of arrangement. This results in higher display quality and better external appearance. Moreover, the liquid crystal display units 10 that are disposed adjacent to each other and in the positions that are inverted from each other have common structures. This is suitable for reducing manufacturing costs.

Further, the frame portion 10FR is configured such that the second linear sections 10FR2 have different widths W1 and 2 from each other, and the liquid crystal display units 10 adjacent to each other are each configured such that the width W1 of the second side part on an adjacent side is smaller than the width W2 of the second side part on a side opposite to the adjacent side. The respective second linear sections 10FR2 of the frame portions 10FR that are adjacent to each other are interposed between two images respectively displayed on the respective display portions 10DS of the liquid crystal display units 10 adjacent to each other. Since the width W1 of each of the second linear sections 10FR2 on the adjacent side is smaller than the width W2 of each of the second linear sections 10FR2 on the sides opposite to the adjacent side, the two images respectively displayed on the respective display portion 10DS of the liquid crystal display units 10 adjacent to each other are placed closer to each other. This results in higher display quality.

Further, each of the liquid crystal display units 10 includes at least a liquid crystal panel 11 (a first display panel, a second display panel) including the display portion 10DS and the frame portion 10FR and a second panel flexible substrate 15B (a first connecting component, a second connecting component) that is mounted to the second linear section 10FR2 of the frame portion 10FR of the liquid crystal panel 11 away from the other liquid crystal unit 10. This makes it possible to secure a sufficient space for mounting the second panel flexible substrates 15B, as the width W2 of the second linear section 10FR2 of the frame portion 10FR of the liquid crystal panel 11 on the side opposite to the adjacent side is larger than the width W1 of the second linear section 10FR2 on the adjacent side.

Further, the liquid crystal display units 10 adjacent to each other are each configured such that the width W2 of the second linear section 10FR2 on the side opposite to the adjacent side is equal to a width W3 of each of the first linear sections 10FR1. That is, in each frame portion 10FR, the width W3 of the first linear sections 10FR1 and the width W2 of one of the second linear sections 10FR2 excluding the second linear section 10FR2 adjacent to the other frame portion 10FR are equal to each other. This results in better external appearance.

Further, each of the liquid crystal display units 10 includes the display controller 26 that controls driving of the corresponding liquid crystal display unit 10 so that the orientations of the image displayed on the liquid crystal display units 10 in the first position and the second position that is inverted from the first position in the direction perpendicular to the arrangement direction correspond with each other. Even if the liquid crystal display units 10 are set in the positions that are inverted from each other and coupled, images are properly displayed on the liquid crystal display units 10, respectively, the control of the driving of the liquid crystal display units 10 by the display controllers 26 to adjust the orientations of the images displayed on the liquid crystal display units 10 in the first position and the second position to correspond with each other with respect to the direction perpendicular to the arrangement direction.

Further, each of the liquid crystal display units 10 includes at least a liquid crystal panel 11 including the display portion 10DS and the frame portion 10FR, a first panel flexible substrate 15A (first connecting component) that is mounted on one of the first linear sections 10FR1 of the frame portion 10FR of the liquid crystal panel 11, and a backlight device 12 (a first lighting device, a second lighting device) that illuminates the liquid crystal panel 11 for image display. The backlight device 12 includes LEDs 21 (light sources) disposed to overlap the other first linear section 10FR1. This causes an image to be displayed on the display portion 10DS of the liquid crystal panel 11 through the utilization of light emitted by the backlight device 12. Since the LEDs 21 of the backlight device 12 are disposed not to overlap the first panel flexible substrates 15A, the first linear sections 10FR1 are more suitably made equal in width W3 to each other than if the LEDs 21 are disposed to overlap the first panel flexible substrates 15A. Further, since the LEDs 21 and the first panel flexible substrates 15A produce heat while in use, disposing them not to overlap each other disperses heat sources to make it hard for locally high-temperature areas to appear.

Other Embodiments

The technology described herein is not limited to the embodiments described above with reference to the drawings. The following embodiments may be included in the technical scope.

(1) The control substrate may be provided with a single input connector to which a video signal and a backlight signal are supplied.

(2) The LED controller may be provided on an LED control substrate provided separately from the control substrate.

(3) The coupled liquid crystal display device may include two liquid crystal display devices coupled to each other in such a manner as to be adjacent to each other in the Y-axis direction.

(4) For example, since commonality of major components (such as liquid crystal panels, optical members, light-guiding plates, reflecting sheets, and detachable LED units) brings about a sufficient cost reduction effect, peripheral components of each of the two liquid crystal display devices other the major components may be different from (non-identical to) those of the other liquid crystal display device. Besides those constituent components named above, which constituent components of the two liquid crystal display devices are commonalized is subject to change as appropriate.

(5) The coupled liquid crystal display device may include three or more liquid crystal display devices arranged adjacent to one another.

(6) The second side parts may have the same width. This is preferably combined with a configuration in which the second panel flexible substrates are omitted.

(7) The width of each of the first side parts constituting the frame unit may be different from the width of one of the second side parts.

(8) The first side parts may have different widths.

(9) The technology described herein is also applicable to a liquid crystal display device including no bezel. For example, in a case where a liquid crystal display device includes a cover glass (protective panel) for protecting a liquid crystal panel and the glass cover is configured to have a light-blocking unit having a frame shape that surrounds a display unit, the light-blocking unit constitutes a frame unit.

(10) It is possible to adopt a configuration in the LED substrate is detachable from the chassis. In that case, it is preferable that the chassis, the bezel, and the like have attaching and detaching slots bored through side surfaces thereof so as to permit attaching and detaching of the LED substrate.

(11) The term "square" encompasses a case where the liquid crystal display device and the liquid crystal panel have any rounded corners.

(12) The light-guiding plate may have one light entrance end face opposed to multiple LED substrates.

(13) It is possible to use a two-side light entrance backlight device. Furthermore, it is also possible to place the LEDs and the LED substrates so that three of the outer peripheral end faces of the light-guiding plate serve as light entrance end faces or place the LEDs and the LED substrate so that all of the outer peripheral end faces of the light-guiding plate serve as light entrance end faces.

(14) The number of panel flexible substrates that are provided, the placement of the panel flexible substrates, and the like are subject to change as appropriate. Further, it is also possible to only use the first panel flexible substrates as the panel flexible substrates and omit the second panel flexible substrates. Further, the backlight flexible flat cable described in the embodiment described above may be replaced by a backlight flexible substrate.

(15) The specific number, type, order of stacking, and the like of optical sheets that are used in the backlight device are subject to change as appropriate.

(16) It is possible to use a side-emitting LED for the light source. It is possible to use a non-LED light source (such as organic EL).

(17) Specific uses of the coupled liquid crystal display device are subject to change as appropriate.

(18) The technology described herein is also applicable to other types of display panel (such as a MEMS (microelectromechanical systems) display panel).

(19) Specific uses of the liquid crystal display device are subject to change as appropriate.

The invention claimed is:

1. A coupled display device comprising:
a first display unit having a rectangular outline, the first display unit including:
a first display portion in which an image is displayed;
a first frame portion having a frame shape to surround the first display portion and including two first linear sections and two second linear sections;
a first display panel including the first display portion and the first frame portion;
a first connecting component mounted to one of the first linear sections; and
a first lighting device to illuminate the first display panel for image display, the first lighting device overlapping another one of the first linear sections; and
a second display unit having a rectangular outline, the second display unit including:
a second display portion in which an image is displayed;
a second frame portion having a frame shape to surround the second display portion and including two third linear sections and two fourth linear sections;
a second display panel including the second display portion and the second frame portion;
a second connecting component mounted to one of the third linear sections; and
a second lighting device to illuminate the second display panel for image display, the second lighting device overlapping another one of the third linear sections, wherein
the first display unit is set in a first position,
the second display unit is set in a second position that is inverted from the first position,
the first display unit and the second display unit are arranged adjacent to each other and coupled,
the first linear sections and the third linear sections extend in an arrangement direction in which the first display unit and the second display unit are arranged,
the second linear sections and the fourth linear sections extend in a direction perpendicular to the arrangement direction, and
one of the second linear sections and one of the fourth linear sections are disposed adjacent to each other.

2. The coupled display device according to claim 1, wherein
the second linear section of the first display unit adjacent to the fourth linear section of the second display unit has a width less than a width of the second linear section away from the second display unit, and
the fourth linear section of the second display unit adjacent to the second linear section has a width less than a width of the fourth linear section away from the first display unit.

3. The coupled display device according to claim 2, wherein the first display unit includes
a third connecting component mounted to the second linear section away from the second display unit, and
the second display unit includes
a fourth connecting component mounted to the fourth linear section away from the first display unit.

4. The coupled display device according to claim 2, wherein the width of the second linear section away from the second display unit and the width of the fourth linear section away from the first display unit are about equal to a width of the first linear sections and third linear sections.

5. The coupled display device according to claim 1, wherein
the first display unit includes a first display controller,
the second display unit includes a second display controller, and
the first display controller and the second display controller are configured to control driving of the first display unit and driving of the second display unit, respectively, so that an orientation of the image displayed on the first display unit and an orientation of the image displayed on the second display unit correspond with each other with respect to the direction perpendicular to the arrangement direction when the first display unit and the second display unit are set in positions that are inverted from each other.

* * * * *